United States Patent
Scherzer et al.

(10) Patent No.: US 10,367,336 B2
(45) Date of Patent: *Jul. 30, 2019

(54) FRAME FOR A SWITCHGEAR CABINET COMPRISING PIVOTABLE HOLDERS FOR DISTRIBUTION BUSBARS, AND PRODUCTION METHOD FOR A SWITCHGEAR CABINET

(71) Applicant: EATON INTELLIGENT POWER LIMITED, Dublin (IE)

(72) Inventors: Martin Scherzer, Brand (AT); Thomas Berger, Zwettl (AT); Guenter Doleschal, Zwettl (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 374 days.

This patent is subject to a terminal disclaimer.

(21) Appl. No.: 15/104,533

(22) PCT Filed: Dec. 5, 2014

(86) PCT No.: PCT/EP2014/076799
§ 371 (c)(1),
(2) Date: Sep. 5, 2016

(87) PCT Pub. No.: WO2015/091039
PCT Pub. Date: Jun. 25, 2015

(65) Prior Publication Data
US 2016/0372894 A1    Dec. 22, 2016

(30) Foreign Application Priority Data

Dec. 16, 2013  (DE) .................. 10 2013 114 105

(51) Int. Cl.
*H02B 1/01* (2006.01)
*H02B 1/20* (2006.01)
(Continued)

(52) U.S. Cl.
CPC ............... *H02B 1/013* (2013.01); *H02B 1/20* (2013.01); *H02B 1/21* (2013.01); *H02B 1/301* (2013.01); *H05K 7/183* (2013.01)

(58) Field of Classification Search
CPC .......... H02B 1/01; H02B 1/012; H02B 1/013; H02B 1/20; H02B 1/21; H02B 1/30;
(Continued)

(56) References Cited

U.S. PATENT DOCUMENTS

| 2,319,415 A | 5/1943 | Lightfoot | |
|---|---|---|---|
| 2006/0082954 A1* | 4/2006 | Wiant | H02B 1/20 361/605 |

FOREIGN PATENT DOCUMENTS

| CN | 1183857 A | 6/1998 |
|---|---|---|
| CN | 1829019 A | 9/2006 |

(Continued)

*Primary Examiner* — Timothy J Thompson
*Assistant Examiner* — Guillermo J Egoavil
(74) *Attorney, Agent, or Firm* — Leydig, Voit & Mayer, Ltd.

(57) ABSTRACT

A frame for a switchgear cabinet has a plurality of interconnected frame profiled elements, and a method produces such a switchgear cabinet. At least two holders vertically spaced apart from one other and having cutouts for distribution busbars are arranged within the outer contour formed by the profiles. In an operating position, the holders are oriented along a vertical axis. The at least two holders are also movable, in particular rotatable, into a fitting position, however, in which the axis is at an angle to the vertical.

15 Claims, 8 Drawing Sheets

(51) Int. Cl.
 *H02B 1/30* (2006.01)
 *H05K 7/18* (2006.01)
 *H02B 1/21* (2006.01)

(58) Field of Classification Search
 CPC . H02B 1/32; H02B 1/301; H02B 5/00; H02B 11/04; H02G 5/02; H02G 5/025; H05K 5/02; H05K 7/18; H05K 7/183
 USPC .................. 174/70 B, 535; 361/605, 624
 See application file for complete search history.

(56) References Cited

FOREIGN PATENT DOCUMENTS

| | | | |
|---|---|---|---|
| CN | 102623901 A | 8/2012 | |
| DE | 4312487 A1 | 10/1994 | |
| DE | 19511349 C1 | 9/1996 | |
| DE | 19511350 A1 * | 10/1996 | ............... H02B 1/21 |
| DE | 19511350 A1 * | 10/1996 | ............... H02B 1/21 |
| DE | 19755690 A1 | 7/1999 | |
| DE | 19953561 C1 | 9/2001 | |
| DE | 10013158 C2 | 10/2001 | |
| DE | 10136680 A1 | 2/2003 | |
| DE | 102007038658 * | 2/2009 | ............... H02B 1/21 |
| DE | 102007038658 A1 * | 2/2009 | ............... H02B 1/21 |
| EP | 1143588 A1 | 10/2001 | |

* cited by examiner

US 10,367,336 B2

FRAME FOR A SWITCHGEAR CABINET COMPRISING PIVOTABLE HOLDERS FOR DISTRIBUTION BUSBARS, AND PRODUCTION METHOD FOR A SWITCHGEAR CABINET

CROSS-REFERENCE TO RELATED APPLICATIONS

This application is a U.S. national stage application under 35 U.S.C. § 371 of International Application No. PCT/EP2014/076799, filed on Dec. 5, 2014, and claims benefit to German Patent Application No. DE 10 2013 114 105.6, filed on Dec. 16, 2013. The International Application was published in German on Jun. 25, 2015, as WO 2015/091039 A1 under PCT Article 21(2).

FIELD

The invention relates to a frame for a switch cabinet including a plurality of interconnected frame profiled elements.

BACKGROUND

A switch cabinet frame of the aforementioned type is known in principle. For example, distribution busbars that extend vertically in the operating position are mounted in the at least two retainers and assume the position of the imaginary cylindrical body. The distribution busbars can be electrically connected in particular to main busbars extending horizontally in the frame and can distribute electrical energy, which is supplied to the distribution busbars, to consumers connected thereto.

The distribution busbars are usually inserted from the top of the switch cabinet. However, this is only possible if the space in which the switch cabinet stands is high enough. Essentially, this has to be twice as high as the switch cabinet. If this is not the case, the switch cabinet has to be moved into a position in which the distribution busbars can be inserted. For example, the switch cabinet is tilted for this purpose, this being comparatively complex owing to its weight.

The proposed method is also particularly disadvantageous in that inserting the distribution busbars is only possible if the main busbars are not installed in the switch cabinet, since these obstruct access to the vertically spaced-apart retainers. Accordingly, the switch cabinet is often equipped with as many distribution busbars as possible, even if it later turns out that not all of these distribution busbars are required. Accordingly, valuable copper, of which the distribution busbars normally consist, is wasted in certain cases. Alternatively, however, the distribution busbars can only be installed in the switch cabinet by a very laborious process once the main busbars have been installed, since a comparatively large number of retainers have to be removed and re-assembled for this purpose.

SUMMARY

An aspect of the invention provides a frame for a switch cabinet, the frame comprising: a plurality of interconnected frame profiled elements, which define a substantially cuboid outer contour; and a first retainer and a second retainer, wherein the retainers are arranged within the substantially cuboid outer contour, wherein the retainers are vertically spaced apart, wherein recesses are arranged in the retainers, forming part of an outer contour of an imaginary, generally cylindrical body, an axis of the generally cylindrical body being oriented vertically when the retainers are in an operating position, and wherein the retainers are configured to be moved into an assembly position in which the axis extends obliquely to vertical.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
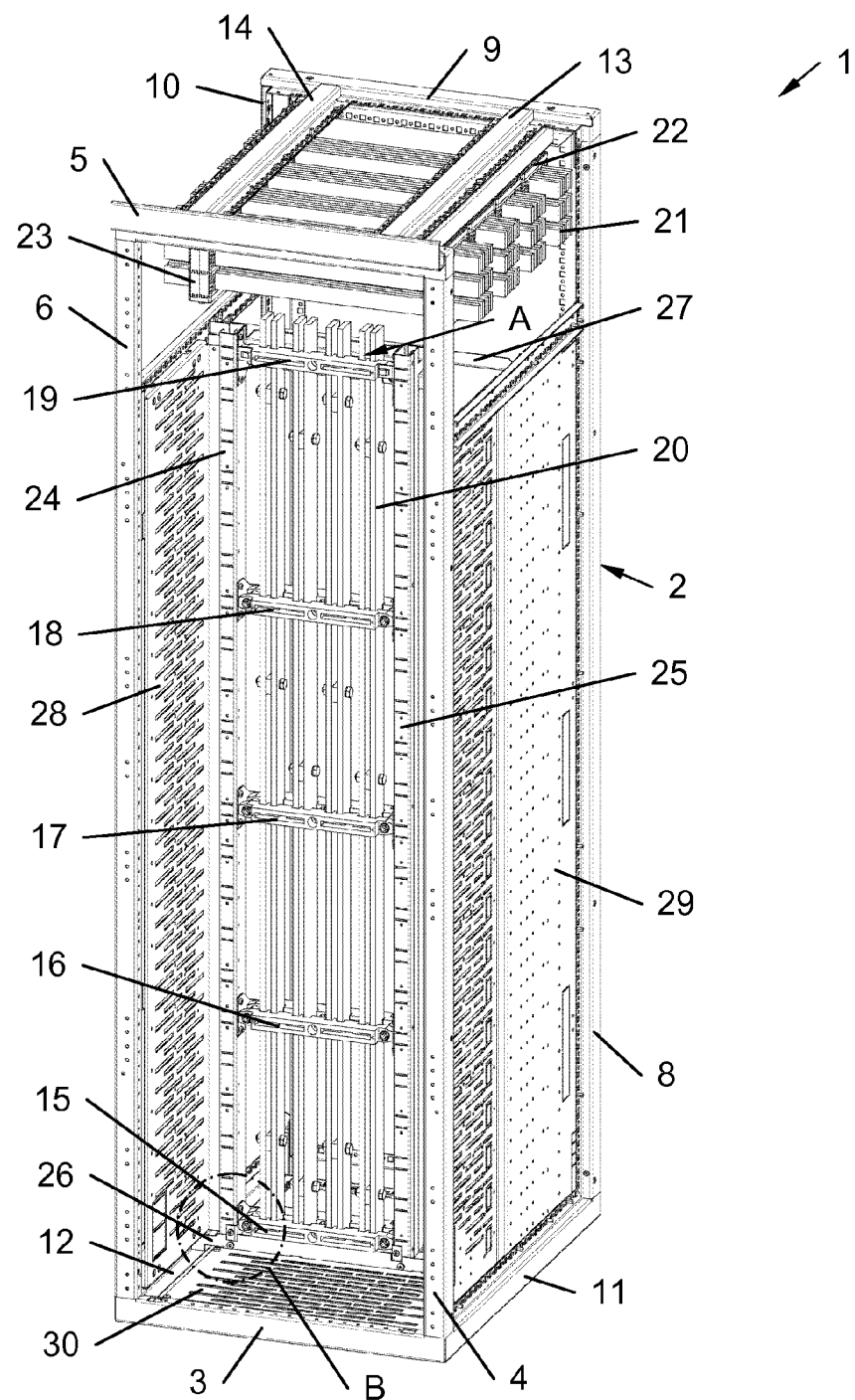
FIG. 1 is a diagonal view of an example switch cabinet frame or switch cabinet.

An aspect of the invention relates to a frame for a switch cabinet, comprising a plurality of interconnected frame profiled elements, which define a substantially cuboid outer contour, and at least two retainers that are arranged within said outer contour and are vertically spaced apart, and in which recesses are arranged that form part of an outer contour of an imaginary, generally cylindrical body, the axis of which is oriented vertically when the retainers are in an operating position. A further aspect of the invention relates to a switch cabinet having both a frame of the aforementioned type and distribution busbars that extend vertically in the operating position, are mounted in the at least two retainers and assume the position of the imaginary cylindrical body. An aspect of the invention also relates to a method for producing a switch cabinet, in which a frame is provided that comprises a plurality of interconnected frame profiled elements, which form a substantially cuboid outer contour, and comprises at least two retainers that are arranged within said outer contour and are vertically spaced apart and in which recesses are arranged that form part of an outer contour of an imaginary, generally cylindrical body, the axis of which is oriented vertically when the retainers are in an operating position.

An aspect of the invention provides an improved frame for a switch cabinet, an improved switch cabinet and an improved method for the production thereof. In particular, the assembly of distribution busbars is intended to be made simpler or more flexible.

An aspect of the invention provides a switch cabinet in which the at least two retainers are movable into an assembly position, in which said axis extends obliquely to the vertical.

An aspect of the invention provides a switch cabinet comprising a frame and distribution busbars that extend vertically in the operating position, are mounted in the at least two retainers and assume the position of the imaginary cylindrical body. In particular, the switch cabinet also comprises main busbars that extend horizontally in the frame and are electrically connected to the distribution busbars.

An aspect of the invention provides a method comprising the steps of:
  moving the at least two retainers into an assembly position, in which said axis extends obliquely to the vertical, provided that said retainers are not already in the assembly position,
  inserting distribution busbars into the recesses in the retainers, and
  moving the at least two retainers back into an operating position.

The proposed measures still allow the distribution busbars to be inserted into the frame or switch cabinet, even when the main busbars have already been assembled, without the retainers of the distribution busbars having to be removed and re-assembled therefor. This makes the production of a switch cabinet simpler or more flexible, and means that, if said switch cabinet is already in use, it can also be subsequently modified.

By moving the retainers into an assembly position, in which said axis extends obliquely to the vertical, the distribution busbars can also be installed on the upright switch cabinet in comparatively small spaces. The oblique position also provides an ergonomic working position. Conductors and other aids can therefore generally be omitted.

A "general cylinder" is a geometric body which is formed by displacing a planar surface or curve along a straight line that does not lie in this plane. This is also referred to as "extrusion" in this context. The straight lines that lead away from the edge of the planar surface or curve in the displacement direction are called "generatrices". These cylinders in particular include cylinders having a circular or polygonal, in particular rectangular or square base.

Additional advantageous embodiments and developments of the invention can be found in the dependent claims and in the description, when viewed together with the figures.

It is expedient for the at least two retainers to be connected by rotatably mounted profiled elements, the longitudinal axes of which are oriented vertically in the operating position and obliquely to the vertical in the assembly position. In this way, the movements of the at least two retainers can be synchronized. In the proposed method for producing a switch cabinet, the at least two retainers are advantageously fixed in the operating position by means of said rotatably mounted profiled elements, in particular by being screwed to the frame profiled elements or to a retainer fastened thereto. This further simplifies the assembly of the distribution busbars.

It is also expedient
  for a first crossmember to be connected to a retainer or to the rotatably mounted profiled elements,
  for the first crossmember to be arranged on a first cover surface of the imaginary, generally cylindrical body, and
  for the first crossmember and the first cover surface to overlap at least in part.

As a result, the imaginary, generally cylindrical body is delimited on one side. A distribution busbar inserted at the location of said body is therefore held in position by the first crossmember with regard to longitudinal displacement.

It is also expedient for a retainer to be integrated in the first crossmember, since the number of components for the frame can thus be reduced.

It is also expedient for a second crossmember to be arranged on the second cover surface of the imaginary, generally cylindrical body and for the second crossmember and the second cover surface to overlap at least in part. As a result, the imaginary, generally cylindrical body is delimited on two sides. A distribution busbar inserted at the location of said body is therefore held in position by the two crossmembers with regard to longitudinal displacement in both directions.

It is also expedient for the at least two retainers, the rotatably mounted profiled elements or the first crossmember to comprise bolts/bushings that are rotatably mounted in bushings/bolts of the frame profiled elements. A swivel joint for the retainers, profiled elements or for the first crossmember can thus be formed in a simple manner.

In a state in which screw connections to the frame profiled elements are loosened, it is advantageous for the first crossmember to loosely abut and/or rest against the frame profiled elements, but for the degrees of freedom thereof to be limited such that said crossmember can only be significantly rotated relative to the frame profiled elements about its longitudinal axis, between the operating position and the assembly position. In this way, a swivel joint which substantially only allows rotation about one axis and consists for example of a combination of a bushings and a bolt, can be omitted. Instead, the first crossmember that is screwed to the frame profiled elements in the operating position only loosely abuts and/or rests against the frame profiled elements to a greater or lesser degree after the screws have been loosened. As a result, the first crossmember can be rotated about its longitudinal axis and therefore the retainer connected to the first crossmember or the profiled elements connected to the first crossmember can be rotated. Significant rotation about another axis and significant displacement are, however, prevented by suitable measures. In this connection, it is particularly advantageous for the first crossmember in this state
  to be rotatable relative to the frame profiled elements about its longitudinal axis at least by 10°, and/or
  to be rotatable relative to the frame profiled elements about a horizontal axis, which is normal to the longitudinal axis, by a maximum of 2°, and/or
  to be displaceable relative to the frame profiled elements by a maximum of 20 mm.

It is furthermore particularly advantageous for the first crossmember/the frame profiled elements to comprise first projections which are mounted in first recesses in the frame profiled elements/in the first crossmember and prevent the first crossmember from moving horizontally relative to the frame profiled elements, in particular moving horizontally transversely to the longitudinal axis thereof. In this way, the position (but not the orientation) of the first crossmember is more or less fixed, a small amount of displacement being permissible. This means that although the first crossmember cannot be displaced considerably, it can be rotated (about its longitudinal axis). For example, said projections can be formed by tabs that engage in recesses (punched-out portions).

It is also particularly advantageous for the first crossmember and/or the frame profiled elements and/or a component arranged on the frame profiled elements to comprise second projections that prevent the first crossmember from rotating about its longitudinal axis relative to the frame profiled elements. This can prevent the retainers for the distribution busbars from being pivoted excessively.

It is expedient for an electrically insulating bottom plate to be arranged on a first cover surface of the imaginary, generally cylindrical body and for the bottom plate and the first cover surface to overlap at least in part. This can prevent the distribution busbars from falling out and can simultaneously insulate the distribution busbars.

It is advantageous for the bottom plate to be releasably mounted in a mounting, in particular in the first crossmember, which is connected to the frame profiled elements, in particular mounted such that it can be released without requiring tools. In this way, the bottom plate can be removed and the distribution busbars can thus also be inserted into the switch cabinet frame from below.

It is expedient in this context for the bottom plate to be arranged in the region of the cuboid outer contour of the frame. This makes the bottom plate easily accessible.

Lastly, it is expedient for the imaginary, generally cylindrical body to be formed as a rectangular, in particular square, prism. As a result, distribution busbars made of flat material can be inserted into the recesses in the retainers.

DETAILED DESCRIPTION OF THE INVENTION

Figure 2:
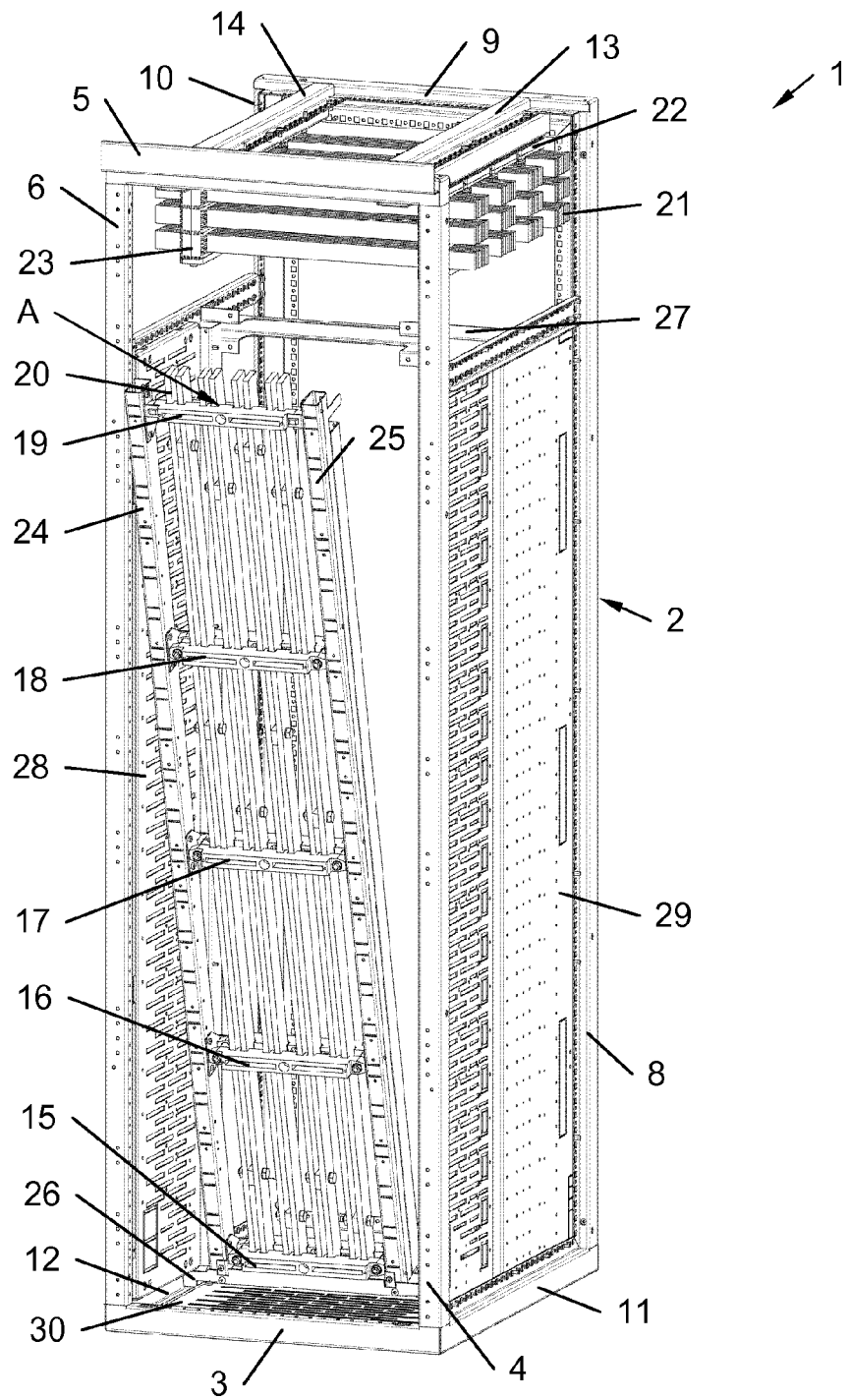
FIG. 2 is a similar view to FIG. 1, but with the distribution busbars pivoted forwards.

FIG. 1 shows a switch cabinet 1 comprising a frame 2. The frame 2 comprises a plurality of interconnected frame profiled elements 3 . . . 14, which define a substantially cuboid outer contour, the frame profiled element 7 being covered and therefore not visible in FIG. 1. Furthermore, the frame 2 comprises a plurality of retainers 15 . . . 19 that are arranged within said outer contour and are vertically spaced apart and in which recesses (A) are arranged that form part of an outer contour of an imaginary, generally cylindrical body, the axis of which is oriented vertically when the retainers 15 . . . 19 are in an operating position. The retainers 15 . . . 19 can also be moved into an assembly position, in which said axis extends obliquely to the vertical, as shown in FIG. 2.

In the example shown in FIG. 1, the imaginary, generally cylindrical bodies are formed as rectangular, in particular square, prisms, the position of which is assumed by a plurality of distribution busbars 20 having the same shape. The distribution busbars 20 are mounted in the retainers 15 . . . 19 and extend vertically in the operating position. The imaginary bodies therefore serve as placeholders, so to speak, for the distribution busbars 20 in the frame 2.

In the example shown, the distribution busbars 20 are electrically connected to main busbars 21 that extend horizontally in the frame 2. The main busbars 21 are, in this case, mounted in retainers 22 and 23. The electrical connection is not specifically shown in FIG. 1. Of course, the main busbars 21 are not necessarily provided or are not necessarily oriented horizontally. The distribution busbars 20 can also be connected to a mains supply in another manner.

In order to synchronize the movements of the retainers 15 . . . 19, said retainers are connected by rotatably mounted profiled elements 24, 25, the longitudinal axes of which are oriented vertically in the operating position and obliquely to the vertical in the assembly position.

The frame 2 further comprises a first crossmember 26, which is connected to the rotatably mounted profiled elements 24, 25 in this example. Alternatively or additionally, the first crossmember 26 can also be connected to the retainer 15. The first crossmember 26 is arranged on a first (lower) cover surface of the imaginary, generally cylindrical body, the first crossmember 26 extending transversely to all the imaginary bodies/distribution busbars 20 and therefore forming the first cover surface thereof or coinciding therewith. As a result, the imaginary, generally cylindrical body is delimited on one side. A distribution busbar 20 inserted at the location of said body is therefore held in position by the first crossmember 26 with regard to longitudinal displacement. To be specific, in the example shown said distribution busbar cannot fall out at the bottom.

The first crossmember 26 extends transversely to all the imaginary bodies/distribution busbars 20 in the example shown. Although this is advantageous, it is not absolutely necessary. It is sufficient per se for the first crossmember 26 and the first cover surface of an imaginary body/a distribution busbar 20 to overlap at least in part. It would also be conceivable for the retainer 15 to be integrated in the first crossmember 26, as a result of which the number of components required for the frame 2 and for the switch cabinet 1 can be reduced.

It would also be conceivable for a second crossmember to be arranged on the second (upper) cover surface of the imaginary, generally cylindrical body or on a distribution busbar 20 and for the second crossmember and the second cover surface to overlap at least in part. As a result, the imaginary, generally cylindrical body is delimited on two sides. A distribution busbar 20 inserted at the location of said body is therefore held in position by the two crossmembers with regard to longitudinal displacement in both directions.

In the example shown, the two profiled elements 24, 25 abut a cross strut 27 in the operating position and can be screwed thereto. In addition, the frame 2 shown in FIG. 1 also comprises side walls 28, 29 and a bottom plate 30.

FIG. 2 shows the frame or the switch cabinet 1 in the assembly position, as already mentioned.

Figure 3:
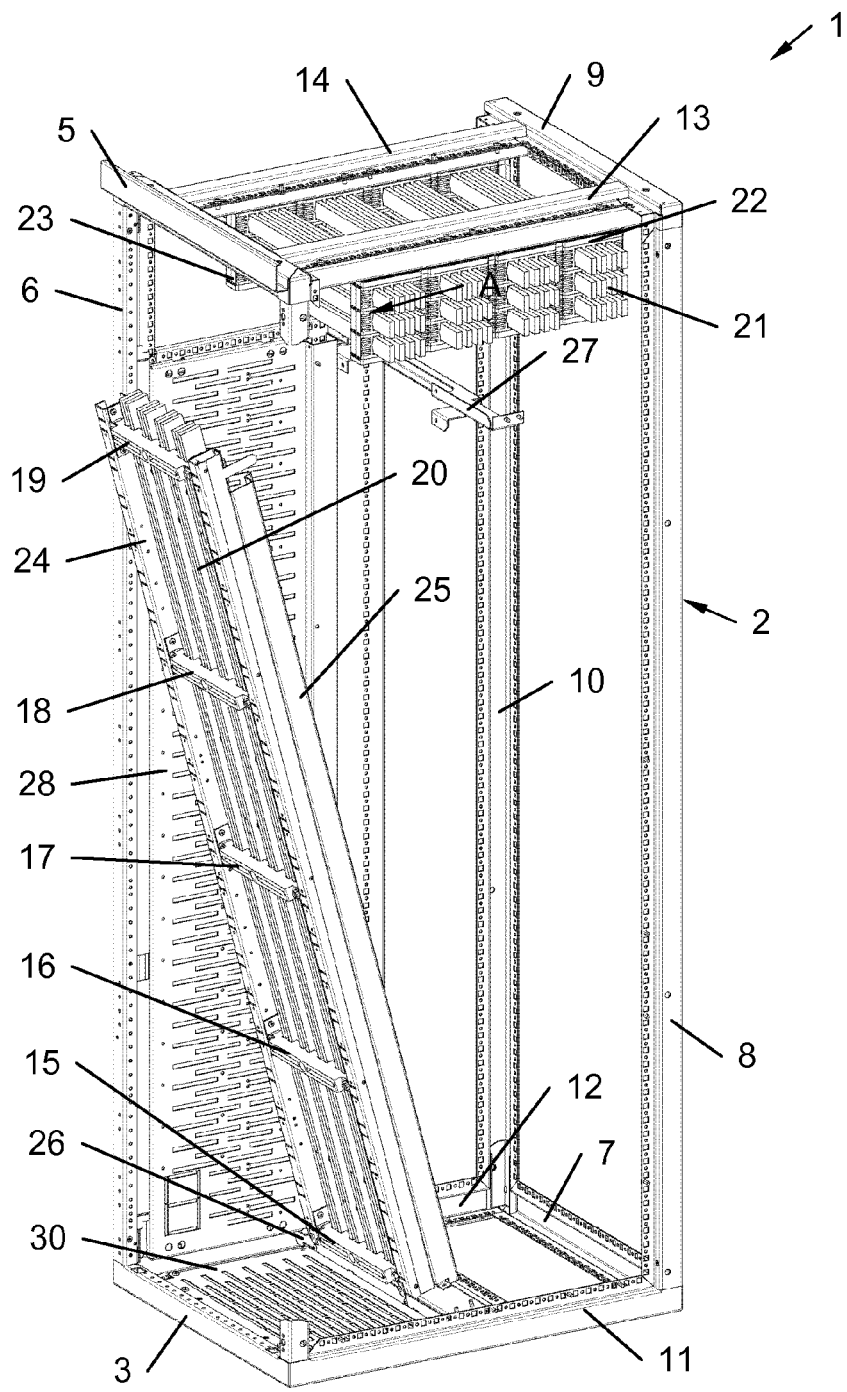
FIG. 3 is a similar view to FIG. 2, but with the side wall removed.

FIG. 3 also shows the frame 2 or the switch cabinet 1 in the assembly position, though slightly more from the side and with a side wall 29 removed.

Figure 4:
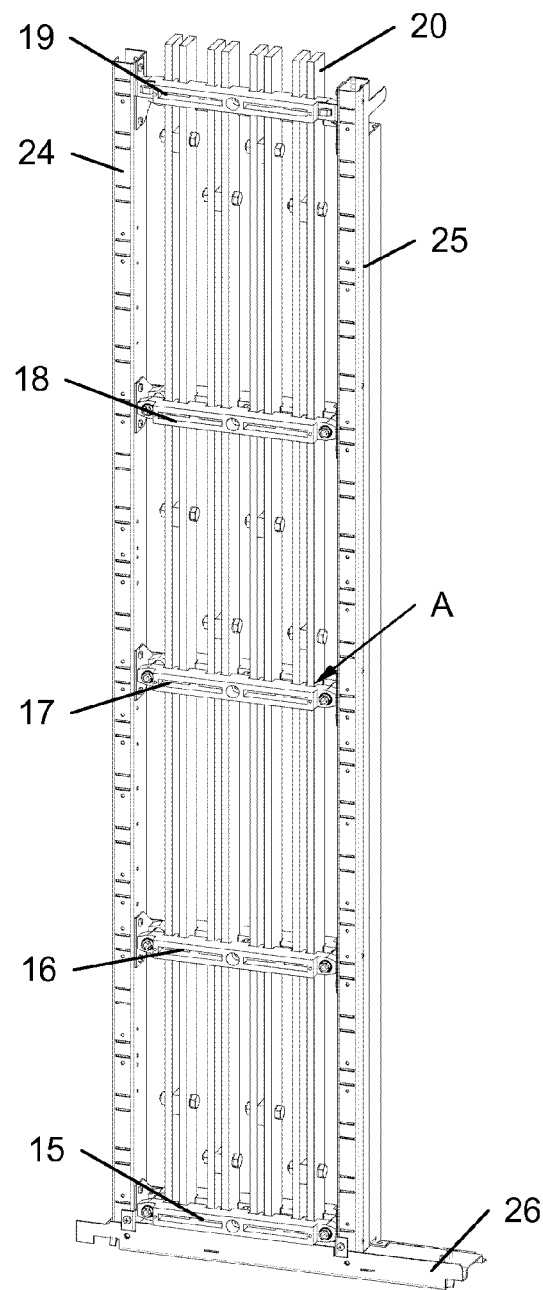
FIG. 4 shows the retainers, the rotatably mounted profiled elements, the distribution busbars and the first crossmember separately.

FIG. 4 shows the retainers 15 . . . 19, the rotatably mounted profiled elements 24, 25, the distribution busbars 20 and the first crossmember 26 which, for the purpose of improved clarity, are shown separately.

In a method for producing a switch cabinet, in which a frame 2 of the type shown is provided, the following steps are carried out:
  moving the retainers 15 . . . 19 into an assembly position, if they are not already in the assembly position (see FIGS. 2 and 3),
  inserting distribution busbars 20 into the recesses in the retainers 15 . . . 19, and
  moving the retainers 15 . . . 19 back into an operating position (see FIG. 1).

In particular, the retainers 15 . . . 19 or the rotatably mounted profiled elements 24, 25 connected to said retainers can be fixed in the operating position, for example by being screwed to the frame profiled elements 3 . . . 14 or to the cross strut 27, as shown in this figure.

Figure 5:
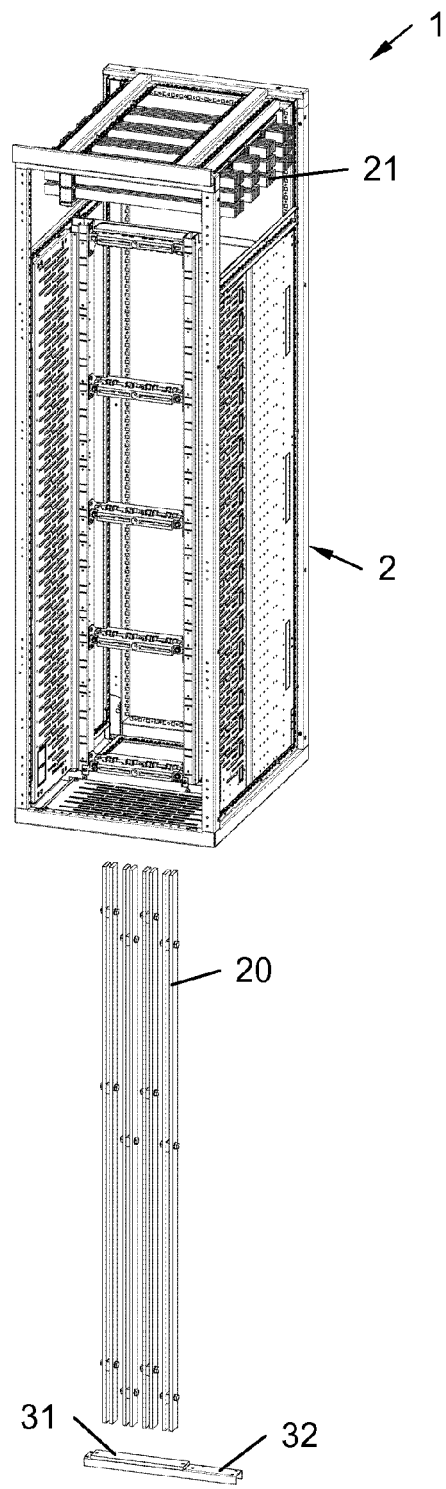
FIG. 5 shows an example switch cabinet frame or switch cabinet having a removable insulating bottom plate.

FIG. 5 shows a variant of the frame 2 or the switch cabinet 1, in which an electrically insulating bottom plate 31 is arranged on a first cover surface of the imaginary, generally cylindrical body. The bottom plate 31 extends transversely to all the imaginary bodies/distribution busbars 20 and thus forms the first cover surface thereof or coincides therewith. As a result, the imaginary, generally cylindrical body is delimited on one side. A distribution busbar 20 inserted at the location of said body is therefore held in position by the bottom plate 31 with regard to longitudinal displacement. To be specific, in the example shown said distribution busbar cannot fall out at the bottom due to the bottom plate 31.

In the example shown, the bottom plate 31 extends transversely to all the imaginary bodies/distribution busbars 20. Although this is advantageous, it is not absolutely necessary. It is sufficient per se for the bottom plate 31 and the first cover surface of an imaginary body/a distribution busbar 20 to overlap at least in part. In this example, the bottom plate 31 is releasably mounted in the first crossmember 26, in particular such that it can be released without requiring tools. Although this is advantageous, it is not absolutely necessary. More generally, the bottom plate 31 can be releasably mounted in a mounting connected to the frame profiled elements 3 . . . 14.

As is clear from FIG. 5, the distribution busbars 20 can be inserted into the frame 2 from below once the bottom plate 31 has been removed, even if the busbars 21 have already been assembled.

The variant disclosed in FIG. 5 can be used together with the measures disclosed in FIGS. 1 to 4.

Advantageously, the bottom plate 31 is also installed in the (rotatable) first crossmember 26, as shown. The distribution busbars 21 can therefore be inserted from below by removing the bottom plate 31 or can be inserted from above by pivoting the arrangement shown in FIG. 4 forwards.

In FIG. 5, the insulating bottom plate 31 is not directly connected to the first crossmember 26, but is indirectly connected thereto by means of the plate support 32. The plate support 32 can advantageously be made of a load-bearing material, for example metal, so that it can support the load of the distribution busbars 20. The bottom plate 31, which is in fact insulating, is assembled on said plate support 32 and can therefore be made of a material having a lower load-bearing capacity. Of course, the insulating bottom plate 31 can, however, also be formed as one piece and can be directly connected to the first crossmember 26. It is advantageous for the bottom plate 31 to be arranged in the region of the cuboid outer contour of the frame 2, in this case in the bottom region.

Figure 6:
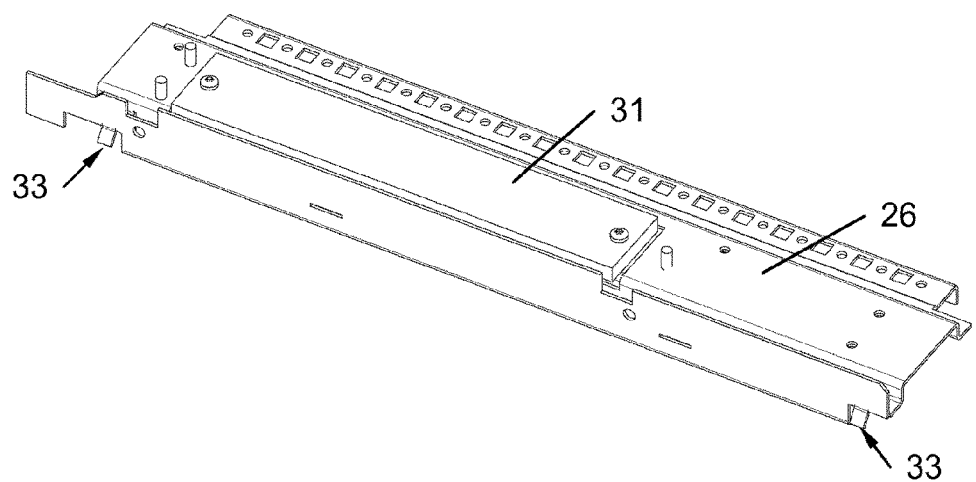
FIG. 6 is a diagonal view of the first crossmember and the insulating bottom plate assembled therein.
Figure 7:
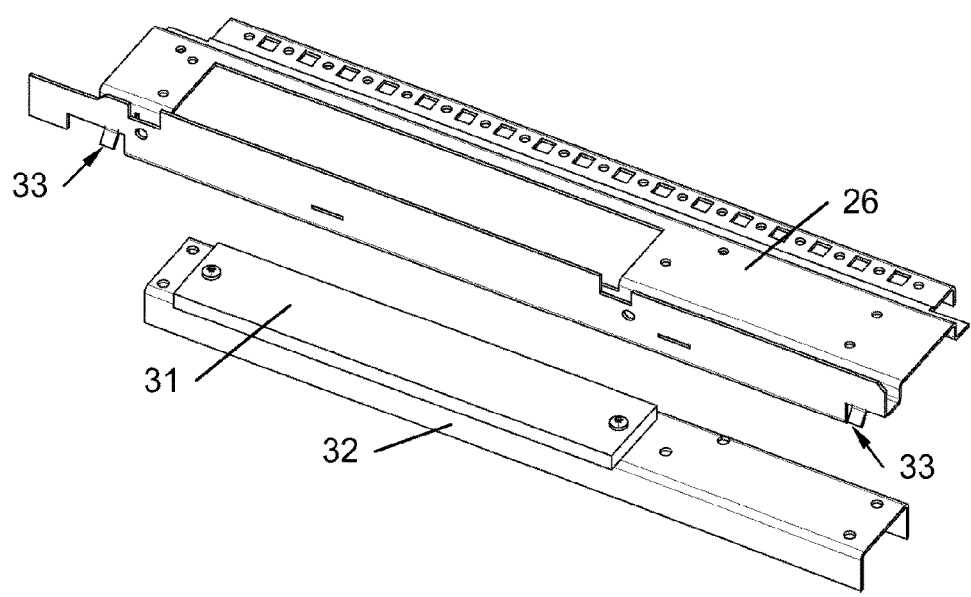
FIG. 7 is an exploded view of the first crossmember and the insulating bottom plate together with the plate support.

FIG. 6 is a diagonal view of the first crossmember 26 and the insulating bottom plate 31 assembled therein. FIG. 7 is an exploded view of FIG. 6 together with the plate support 32.

A method for producing a switch cabinet, in which a frame 2 of the type shown is provided, comprises the steps of:

removing the electrically insulating bottom plate 31, which is arranged on a first cover surface of the imaginary, generally cylindrical body, if not already done so, inserting distribution busbars 20 into the recesses in the retainers, and fastening the bottom plate 31 in the mounting formed by the first crossmember 26.

In general, the arrangement shown in FIG. 4 (see FIGS. 2 and 3) can be pivoted by one of the retainers 15 . . . 19, the profiled elements 24, 25 or the first crossmember 26 comprising bolts/bushings that are rotatably mounted in bushings/bolts of the frame profiled elements 3 . . . 14.

However, in a state in which screw connections to the frame profiled elements 3 . . . 14 are loosened, it is advantageous for the first crossmember 26 to loosely abut and/or rest against the frame profiled elements 3 . . . 14, but for the degrees of freedom thereof to be limited such that said crossmember can only be significantly rotated relative to the frame profiled elements 3 . . . 14 about its longitudinal axis, between the operating position and the assembly position.

In this way, a swivel joint which substantially only allows rotation about one axis and consists of a combination of a bushing and a bolt can be omitted. Instead, the first crossmember 26, which is preferably screwed to the frame profiled elements 3 . . . 14 in the operating position, only loosely abuts and/or rests against the frame profiled elements 3 . . . 14 to a greater or lesser degree after the screws have been loosened. As a result, the first crossmember 26 can rotate about its longitudinal axis and therefore the arrangement according to FIG. 4 can rotate.

The first crossmember 26 preferably comprises first projections, which are mounted in first recesses in the frame profiled elements 3 . . . 14 and prevent the first crossmember 26 from moving horizontally relative to the frame profiled elements 3 . . . 14, in particular moving horizontally in a direction transverse to the longitudinal axis thereof.

Figure 8:
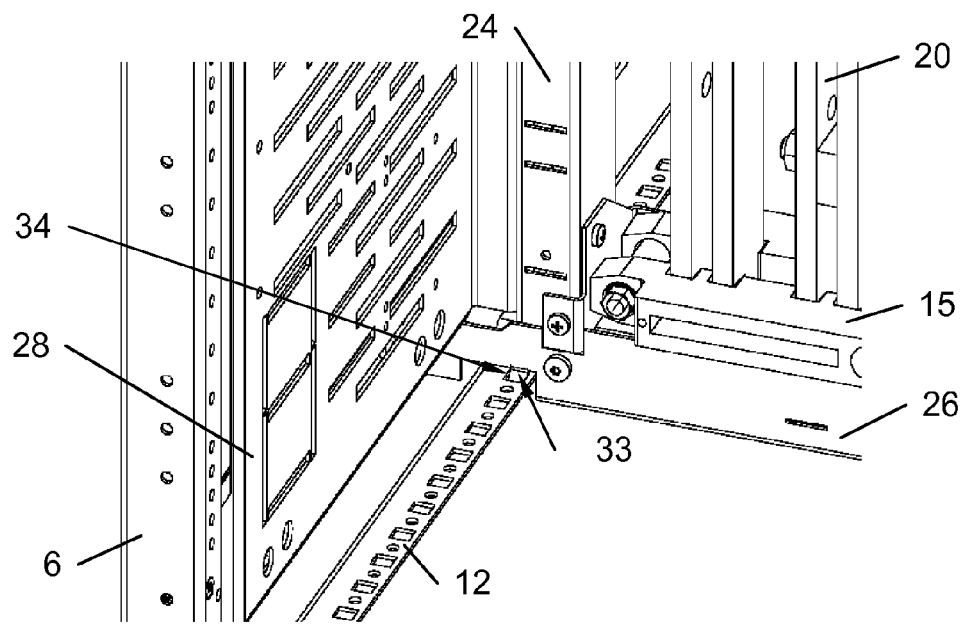
FIG. 8 is a detail of the example switch cabinet frame or switch cabinet from FIG. 1.
Figure 9:
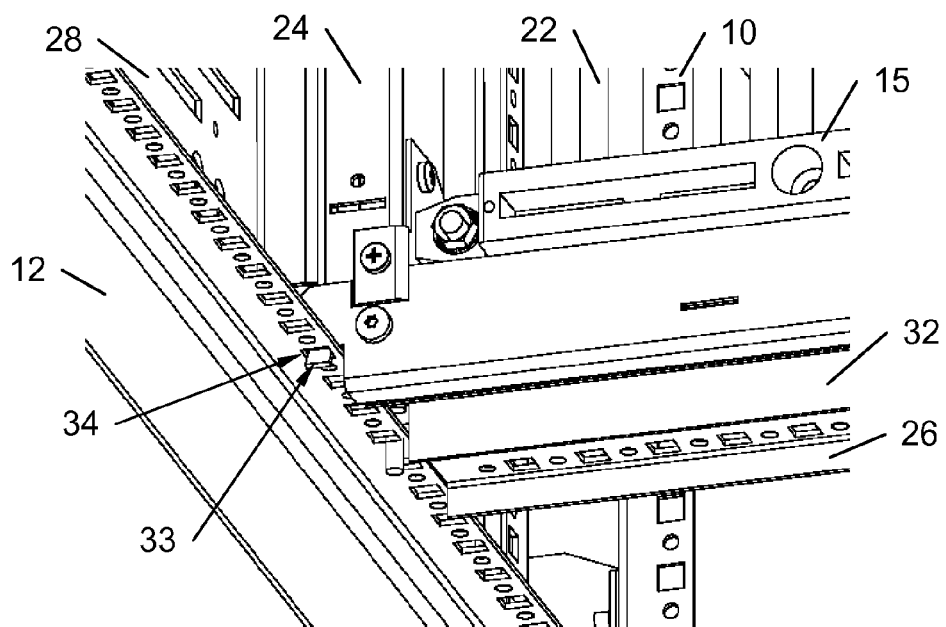
FIG. 9 shows the detail in FIG. 8 from below.
Figure 10:
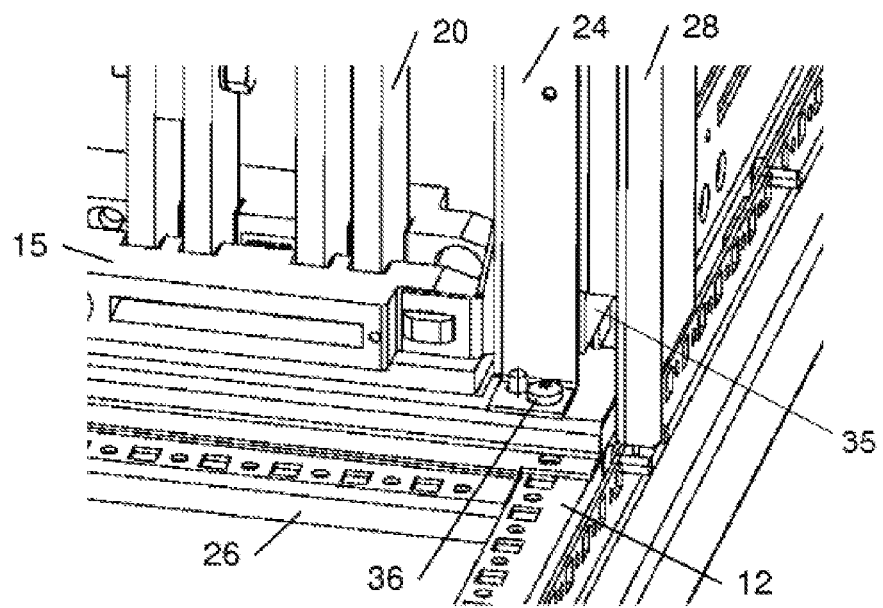
FIG. 10 is a diagonal view from behind of the detail in FIG. 8.
Figure 11:
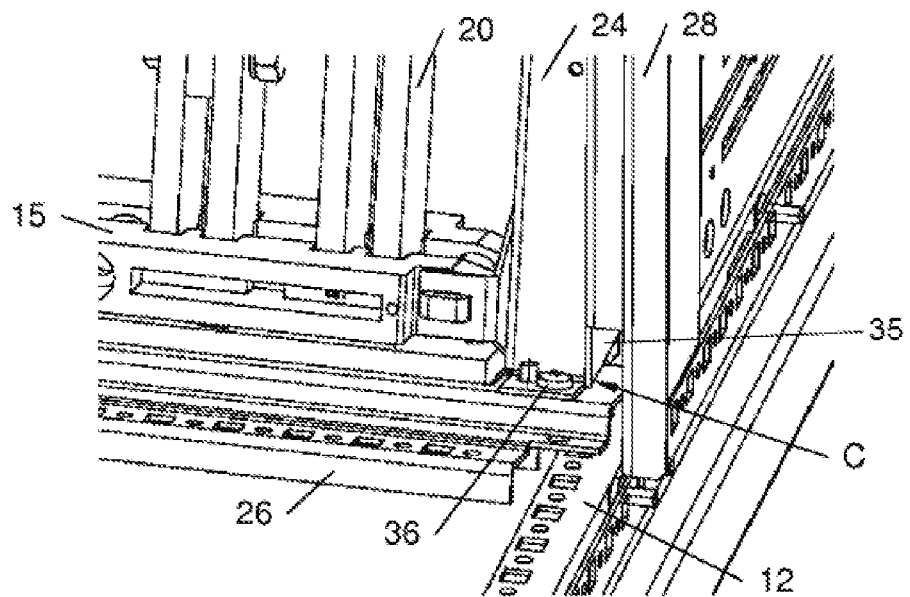
FIG. 11 is a side view from behind of the detail in FIG. 8.

In this regard, FIGS. 8 to 11 show an example, specific embodiment. FIG. 8 shows the detail B incorporated in FIG. 1. FIG. 9 is a diagonal view from below of this detail. FIG. 10 is a diagonal view from behind of said detail with vertical busbars 20, and FIG. 11 shows the view of this said from FIG. 10 with oblique busbars 20.

In this example, said projections are formed by tabs 33 (see also FIGS. 6 and 7), which are mounted in recesses 34 in the frame profiled elements 11 and 12. As a result, displacement of the first crossmember 26 is significantly restricted. Although the first crossmember 26 therefore cannot be displaced considerably, it can be rotated about its longitudinal axis. As a result, the arrangement shown in FIG. 4 can be tilted forwards, but does not slide away backwards. Alternatively to the tabs 33 in the first crossmember 26 and the punched-out portion 34 in the frame profiled elements 11, 12, the first crossmember 26 could equally comprise recesses and the frame profiled elements 11, 12 could comprise tabs. It would also be conceivable, for example, for the projections to be formed by bolts or screws.

The first crossmember 26 and/or the frame profiled elements 3 . . . 14 and/or a component arranged on the frame profiled elements 3 . . . 14 advantageously comprise second projections, which prevent the first crossmember 26 rotating relative to the frame profiled elements 3 . . . 14, in particular rotating about its longitudinal axis. In the example shown, the side walls 28, 29 comprise projections 35, with which the first crossmember 26 comes into abutting contact when the arrangement shown in FIG. 4 is tilted forwards. In this way, the pivot movement of said arrangement is limited. In this regard, FIG. 11 shows a state in which the arrangement shown in FIG. 4 has been pivoted out of the operating position and into the assembly position and the first crossmember 26 abuts the projection 35 (see the contact point C). In addition, FIG. 10 also shows a screw 36, by means of which the first crossmember 26 is fixed in its operating position.

The frame is advantageously designed using the measures shown such that, in a state in which screw connections 36 to the frame profiled elements 11, 12 are loosened, the first crossmember 26 can be rotated about its longitudinal axis relative to the frame profiled elements 3 . . . 14 at least by 10°, and/or can be rotated by a maximum of 2° about a horizontal axis, which is normal to the longitudinal axis, relative to the frame profiled elements 3 . . . 14, and/or can be displaced relative to the frame profiled elements 3 . . . 14 by a maximum of 20 mm.

To conclude, it is noted that the frame 2 and the switch cabinet 1 are not necessarily shown to scale and can therefore also have other proportions. Furthermore, the frame 2/the switch cabinet 1 can also comprise more or fewer components than shown. Positional information (e.g. "above", "below", "left", "right", etc.) relate to the respective figure being described and in the event of a change in position of the frame 2/the switch cabinet 1, are to be adapted accordingly to the new position. Finally, it is noted that the above embodiments and developments of the invention can be combined in any way.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A frame for a switch cabinet, the frame comprising:
a plurality of interconnected frame profiled elements, which define a substantially cuboid outer contour; and
a first retainer and a second retainer,
wherein the retainers are arranged within the substantially cuboid outer contour,
wherein the retainers are vertically spaced apart,
wherein recesses are arranged in the retainers, forming part of an outer contour of an imaginary, generally cylindrical body, an axis of the generally cylindrical body being oriented vertically when the retainers are in an operating position,
wherein the retainers are configured to be moved into an assembly position in which the axis extends obliquely to vertical,
wherein the retainers are connected by rotatably mounted profiled elements, and wherein longitudinal axes of the rotatably mounted profiled elements are oriented vertically in the operating position and obliquely to the vertical in the assembly position.

2. The frame of claim 1, further comprising:
a first crossmember, connected to one or more of the retainers or to the rotatably mounted profiled elements,
wherein the first crossmember is arranged on a first cover surface of the imaginary, generally cylindrical body, and
wherein the first crossmember and the first cover surface overlap at least in part.

3. The frame of claim 2, wherein one or more of the retainers is integrated in the first crossmember.

4. The frame of claim 1, further comprising:
a second crossmember, arranged on a second cover surface of the imaginary, generally cylindrical body and the second crossmember and the second cover surface overlap at least in part.

5. The frame of claim 2, wherein the retainers, the rotatably mounted profiled elements, or the first crossmember include bolts and/or bushings that are rotatably mounted in respective bolts and/or bushings of the interconnected frame profiled elements.

6. The frame of claim 2, wherein, in a state in which screw connections to the interconnected frame profiled elements are loosened, the first crossmember loosely abuts and/or rests against the interconnected frame profiled elements,
wherein degrees of freedom of the first crossmember are limited such that the crossmember can only be significantly rotated relative to the interconnected frame profiled elements about its longitudinal axis, between the operating position and the assembly position.

7. The frame of claim 6, wherein, in the state, the first crossmember
can be rotated relative to the interconnected frame profiled elements about its longitudinal axis at least by 10°, and/or
can be rotated relative to the interconnected frame profiled elements about a horizontal axis, which normal to the longitudinal axis, by a maximum of 2°, and/or
can be displaced relative to the interconnected frame profiled elements by a maximum of 20 mm.

8. The frame of claim 6, wherein the first crossmember and/or the interconnected frame profiled elements include first projections which are mounted in first recesses in the interconnected frame profiled elements and/or in the first crossmember, and
wherein the first projections prevent the first crossmember from moving horizontally relative to the interconnected frame profiled elements.

9. The frame of claim 6, wherein
the first crossmember and/or
the interconnected frame profiled elements and/or
a component arranged on the interconnected frame profiled elements
includes second projections that prevent the first crossmember from rotating about its longitudinal axis relative to the interconnected frame profiled elements.

10. The frame of claim 2, further comprising:
an electrically insulating bottom plate, arranged on a first cover surface of the imaginary, generally cylindrical body,
wherein the electrically insulating bottom plate and the first cover surface overlap at least in part.

11. The frame of claim 10, wherein the electrically insulating bottom plate is releasably mounted in a mounting.

12. A switch cabinet, comprising:
the frame of claim 1; and
distribution busbars that extend vertically in the operating position,
wherein the distribution busbars are mounted in the retainers and assume the position of the imaginary, generally cylindrical body.

13. The cabinet of claim 12, further comprising:
main busbars that extend horizontally in the frame,
wherein the main busbars are electrically connected to the distribution busbars.

14. The frame of claim 8, wherein the first projections prevent the first crossmember from moving horizontally transversely to a longitudinal axis of the interconnected frame profiled elements.

15. The frame of claim 10, wherein the electrically insulating bottom plate is releasably mounted in the first crossmember, which is connected to the interconnected frame profiled elements,
and/or
wherein the electrically insulating bottom plate is mounted such that it can be released without a tool.

* * * * *